(12) United States Patent
Onodera (10) Patent No.: US 9,473,102 B2
(45) Date of Patent: Oct. 18, 2016

(54) LEVEL ADJUSTING CIRCUIT, DIGITAL SOUND PROCESSOR, AUDIO AMP INTEGRATED CIRCUIT, ELECTRONIC APPARATUS AND METHOD OF AUTOMATICALLY ADJUSTING LEVEL OF AUDIO SIGNAL

(71) Applicant: ROHM CO., LTD., Ukyo-ku, Kyoto (JP)

(72) Inventor: Takeshi Onodera, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/745,897

(22) Filed: Jun. 22, 2015

(65) Prior Publication Data

US 2015/0372653 A1 Dec. 24, 2015

(30) Foreign Application Priority Data

Jun. 23, 2014 (JP) .................. 2014-128574

(51) Int. Cl.
  *H03G 7/00* (2006.01)
  *H03G 9/02* (2006.01)
  *H03G 9/00* (2006.01)

(52) U.S. Cl.
  CPC ............ *H03G 9/025* (2013.01); *H03G 9/005* (2013.01)

(58) Field of Classification Search
  CPC ........ H03G 7/002; H03G 7/007; H03G 7/06; H03G 9/025; H03G 9/005
  See application file for complete search history.

(56) References Cited

U.S. PATENT DOCUMENTS

| 5,870,425 A * | 2/1999 | Piaget .................... H04B 1/707 375/147 |
| 6,798,881 B2 * | 9/2004 | Thomasson ........... H04M 9/087 379/406.07 |
| 9,318,126 B2 * | 4/2016 | Shidoji ............... G10L 21/0364 |
| 2003/0020558 A1 * | 1/2003 | Tiihonen ............. H04W 52/367 333/17.1 |

FOREIGN PATENT DOCUMENTS

JP  2011082961 A  4/2011

\* cited by examiner

*Primary Examiner* — Simon Sing
(74) *Attorney, Agent, or Firm* — Cantor Colburn LLP

(57) ABSTRACT

Level adjusting circuit for adjusting level of input audio signal, includes: N filters, N being integer of two or more; N dynamic range compression (DRC) circuits corresponding to N filters; adder; (N−1) band pass filters corresponding to crossover frequencies of N filters; and (N−1) gain correcting units corresponding to (N−1) band pass filters. Each filter receives and passes input audio signal through its respective set band. $i^{th}$ ($1 \le i \le N$) DRC circuit amplifies signal from $i^{th}$ filter and adjust its gain to prevent level of its output signal from exceeding threshold level. Adder adds each of output signals of DRC circuits. $j^{th}$ ($1 \le j \le N-1$) band pass filter passes band including crossover frequencies of $j^{th}$ and $(j+1)^{th}$ filters from output signal of adder. $j^{th}$ gain correcting unit adjusts at least one of gains of $j^{th}$ and $(j+1)^{th}$ DRC circuits based on level of output signal of $j^{th}$ band pass filter.

14 Claims, 10 Drawing Sheets

LEVEL ADJUSTING CIRCUIT, DIGITAL SOUND PROCESSOR, AUDIO AMP INTEGRATED CIRCUIT, ELECTRONIC APPARATUS AND METHOD OF AUTOMATICALLY ADJUSTING LEVEL OF AUDIO SIGNAL

CROSS-REFERENCE TO RELATED APPLICATIONS

The present invention claims priority under 35 U.S.C. §119 to Japanese Application No. 2014-128574, filed on Jun. 23, 2014, the entire content of which is incorporated herein by reference.

TECHNICAL FIELD

The present disclosure relates to audio signal processing, and more particularly relates to a level adjusting circuit.

BACKGROUND

Figure 1:
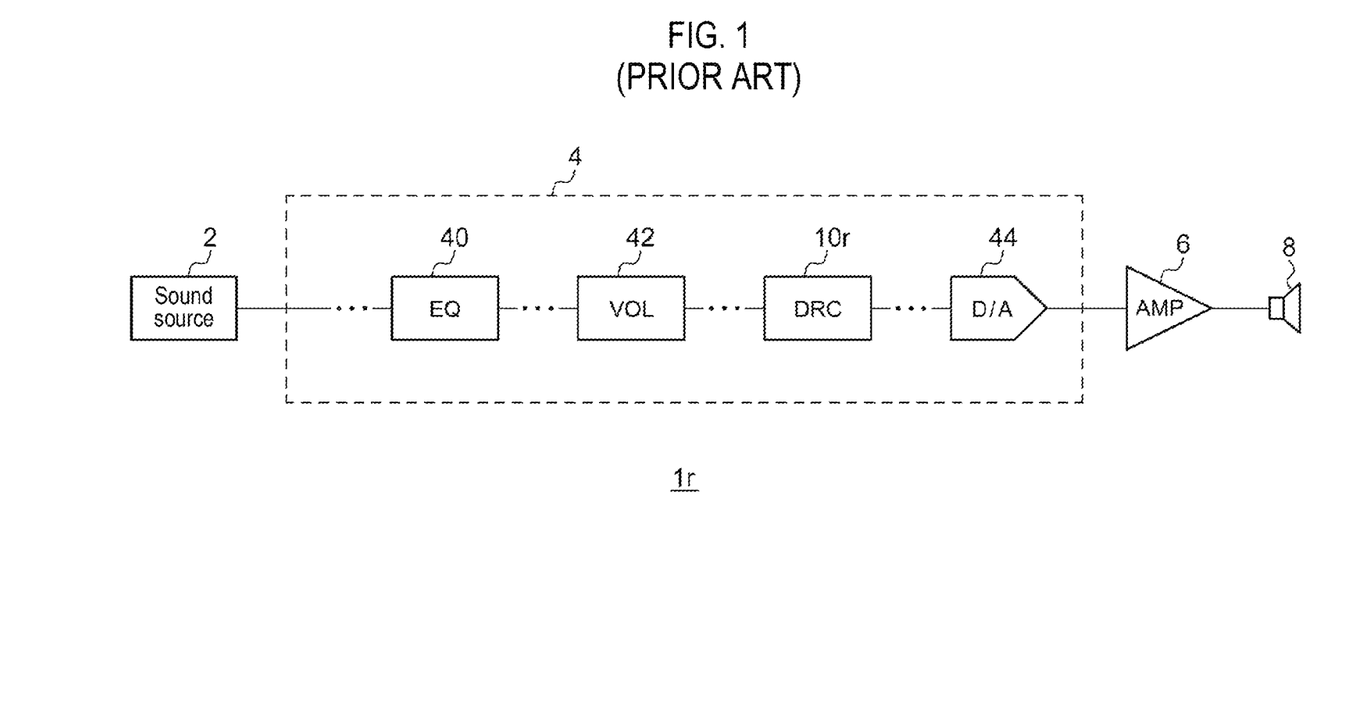
FIG. 1 is a block diagram of a general audio system.

FIG. 1 is a block diagram of a general audio system 1r. The audio system 1r includes a sound source 2, a digital sound processor (DSP) 4, an amplifier (AMP) 6, and an electro-acoustic transducer 8.

The electro-acoustic transducer 8, such as a speaker, a headphone or the like, converts an electric signal into an audible signal. The DSP 4 receives an audio signal from the sound source 2 and subjects the audio signal to a variety of signal processing to convert the audio signal into an analog audio signal. For example, the DSP 4 includes an equalizer 40, a volume circuit 42, and a D/A converter 44. The equalizer 40 changes the frequency characteristics of the audio signal. The volume circuit 42 controls a level (amplitude level) of the audio signal so that a user can obtain a desired volume. The D/A converter 44 converts a digital audio signal into an analog audio signal. The AMP 6 amplifies the analog audio signal to drive the electro-acoustic transducer 8.

As a result of the signal processing by the equalizer 40 and the volume circuit 42, if the level of the audio signal is increased, there may arise problems such as distortion of the audio signal due to clipping of the audio signal by a power rail and/or damage to the electro-acoustic transducer 8 due to an excessive input and/or case resonance. In order to avoid these problems, a level adjusting circuit 10r may be provided in the DSP 4.

Figure 2:
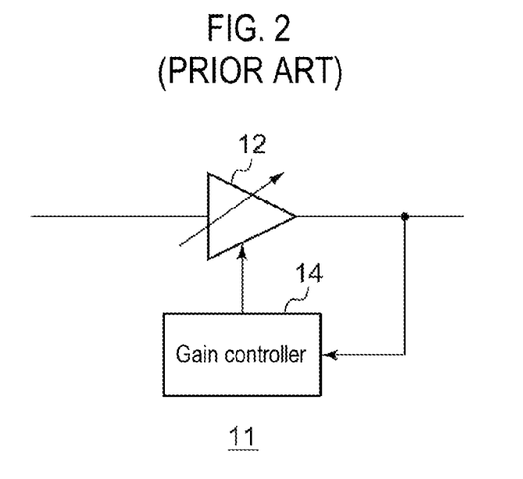
FIG. 2 is a circuit diagram showing the configuration of a DRC circuit serving as a level adjusting circuit.

FIG. 2 is a circuit diagram showing the configuration of a DRC (Dynamic Range Compression) circuit 11 serving as the level adjusting circuit 10r. The DRC circuit 11 includes a variable gain amplifier 12 and a gain controller 14. The gain controller 14 detects a level of an output signal of the variable gain amplifier 12 and decreases (compresses) the gain of the variable gain amplifier 12 if the detected level of the output signal exceeds a predetermined threshold level (attack level). On the other hand, if the detected level of the output signal of the variable gain amplifier 12 continues to be lower than the threshold level, the gain controller 14 increases the gain of the variable gain amplifier 12. The operation of decreasing the gain of the variable gain amplifier 12 is referred to as attack, whereas the operation of increasing the gain to the original level is referred to as recovery. With the DRC circuit 11, its output level is clamped to be prevented from exceeding a threshold level, thereby preventing an excessive input to the amplifier 6 and the electro-acoustic transducer 8 in the subsequent stage.

The audio signal input to the DRC circuit 11 has a variety of frequency components ranging from low to high bands. For example, if only the low band has an excessive input level and the middle to high bands have a normal input level, gains for the middle to high band components are also decreased when the gain compression is applied, which may result in inaudible voice and deteriorated sound quality.

Figure 3A:
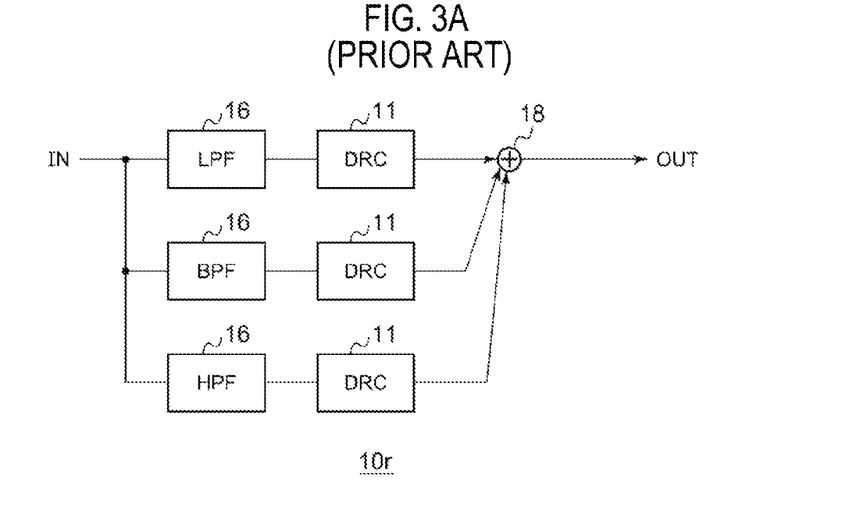
FIGS. 3A and 3B are circuit diagrams showing a configuration example of the level adjusting circuit including the DRC circuit for each band.

FIGS. 3A and 3B are circuit diagrams showing a configuration example of the level adjusting circuit 10r including the DRC circuit 11 for each band. The level adjusting circuit 10r of FIG. 3A includes a plurality of filters 16, a plurality of DRC circuits 11, and an adder 18. The plurality of filters 16 divides an input audio signal into a plurality of (for example, three) bands. The plurality of DRC circuits 11 subjects the corresponding bands to DRC processing. The adder 18 adds (re-synthesizes) outputs of the plurality of DRC circuits 11. With the level adjusting circuit 10r shown in FIG. 3A, the problem of deterioration of sound quality such as inaudibility of the middle to high bands due to an excessive input to the low band may be overcome.

Figure 4:
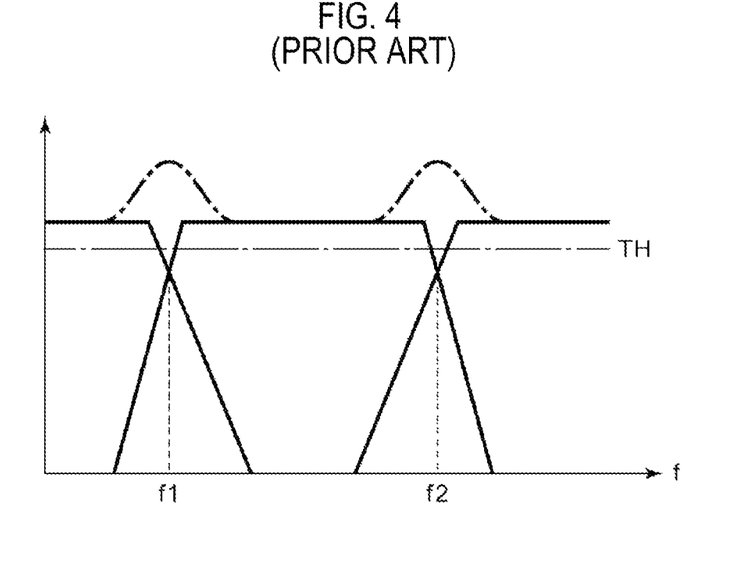
FIG. 4 is a view showing the frequency characteristics of the level adjusting circuit of FIG. 3A.

The present inventor has studied the level adjusting circuit 10r of FIG. 3A and has perceived the following problems. FIG. 4 is a view showing the frequency characteristics of the level adjusting circuit 10r of FIG. 3A. In general, an attenuation gradient of each filter 16 is about 6 dB/Oct and a gain of each filter 16 at the crossover frequencies f1 and f2 is smaller than that at the pass band. Therefore, when a signal having a crossover frequency is input, since the signal level of each band does not exceed a threshold level TH, no gain compression is applied. As a result, a signal output from the adder 18 has the raised frequency characteristics in the vicinity of the crossover frequency, which results in poor sound quality.

Figure 3B:
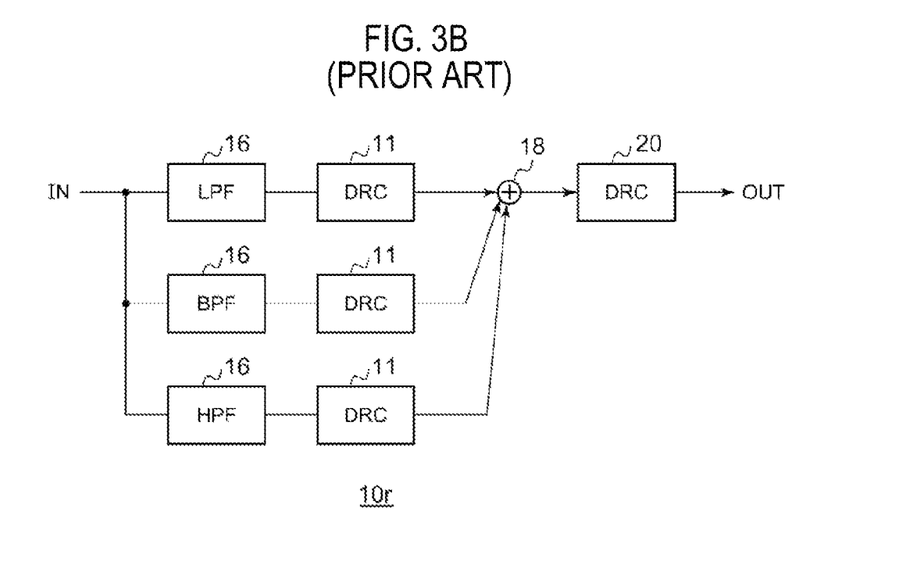

In order to overcome this problem, as shown in FIG. 3B, a DRC circuit 20 may be provided in a stage subsequent to the adder 18. However, this configuration may be undesirable since the effect of division of the input audio signal into the plurality of bands in the previous stage is decreased. In addition, if the DRC circuits 11 at the previous stage and the DRC circuit 20 at the subsequent stage perform an attack operation or a recovery operation simultaneously, gain fluctuation becomes too large, which may result in disharmony of the hearing sense.

SUMMARY

The present disclosure provides some embodiments of a level adjusting circuit which is capable of improving sound quality.

According to one embodiment of the present disclosure, there is provided a level adjusting circuit for adjusting a level of an input audio signal, including: a plurality of N filters, wherein each of the filters is configured to receive the input audio signal and pass the received input audio signal through its respective set band, and N is an integer of two or more; a plurality of N dynamic range compression (DRC) circuits corresponding to the N filters, wherein an $i^{th}$ ($1 \le i \le N$) DRC circuit of the plurality of N DRC circuits is configured to amplify a signal from an $i^{th}$ filter of the plurality of N filters and adjust a gain of the $i^{th}$ DRC circuit so as to prevent a level of an output signal of the $i^{th}$ DRC circuit from exceeding a predetermined threshold level; an adder configured to add each of the output signals of the N DRC circuits; (N−1) band pass filters corresponding to crossover frequencies of the N filters, wherein a $j^{th}$ ($1 \le j \le N-1$) band pass filter of the (N−1) band pass filters is configured to pass a band including crossover frequencies of $j^{th}$ and $(j+1)^{th}$ filters of the plurality of N filters from an output signal of the adder; and (N−1) gain correcting units corresponding to the (N−1) band pass filters, wherein a $j^{th}$ gain correcting unit of the (N−1) gain correcting units is configured to adjust at least one of gains of $j^{th}$ and $(j+1)^{th}$ DRC circuits of the plurality of N DRC circuits based on a level of an output signal of the $j^{th}$ band pass filter.

According to this embodiment, it is possible to improve the sound quality since DRC processing for each band is possible. In addition, since the gains of the DRC circuits are adjusted based on the signal levels of the bands including the crossover frequencies, it is possible to suppress an upsurge of the signal levels at the crossover frequencies.

If the level of the output signal of the $j^{th}$ band pass filter exceeds a predetermined threshold level, the $j^{th}$ gain correcting unit may decrease at least one of the gains of the $j^{th}$ and $(j+1)^{th}$ DRC circuits.

If the $j^{th}$ and $(j+1)^{th}$ DRC circuits are in a non-attack operation state, the $j^{th}$ gain correcting unit may decrease the gains of the $j^{th}$ and $(j+1)^{th}$ DRC circuits. Accordingly, it is possible to prevent the concurrence of the automatic gain adjustment by the DRC circuits and the gain correction by the gain correcting unit, thereby reducing the disharmony of the hearing sense.

The level adjusting circuit may be integrated on a single semiconductor substrate. As used herein, the term "integrated" is intended to include both of a case where all elements of a circuit are formed on a semiconductor substrate and a case where main elements of the circuit are integrated on the semiconductor substrate. In addition, some resistors, capacitors and the like for adjustment of a circuit constant may be provided outside the semiconductor substrate. By integrating the circuit on a single chip, it is possible to reduce a circuit area and maintain characteristics of circuit elements uniformly.

According to another embodiment of the present disclosure, there is provided a digital sound processor including one of the above-described level adjusting circuits.

According to another embodiment of the present disclosure, there is provided an electronic apparatus including: an electro-acoustic transducer; a digital sound processor including one of the above-described level adjusting circuits; a pulse modulator configured to receive an audio signal output from the digital sound processor and generate a pulse signal which is pulse-modulated based on the audio signal; and a D-class amplifier configured to receive the pulse signal and drive the electro-acoustic transducer.

According to another embodiment of the present disclosure, there is provided an audio amplifier integrated circuit including: a digital sound processor including one of the above-described level adjusting circuits; a pulse modulator configured to receive an audio signal output from the digital sound processor and generate a pulse signal which is pulse-modulated based on the audio signal; and a D-class amplifier configured to receive the pulse signal.

According to another embodiment of the present disclosure, there is provided an electronic apparatus including: an electro-acoustic transducer; and the above-described audio amplifier integrated circuit configured to drive the electro-acoustic transducer.

Any combinations of the above-described elements or changes of the representations of the present disclosure between methods, apparatuses and systems are effective as embodiments of the present disclosure.

DETAILED DESCRIPTION

Preferred embodiments of the present invention will now be described in detail with reference to the drawings. Throughout the drawings, the same or similar elements, members and processes are denoted by the same reference numerals and explanation of which will not be repeated. The disclosed embodiments are provided for the purpose of illustration, not limitation, of the present disclosure and all features and combinations thereof described in the embodiments cannot be necessarily construed to describe the spirit of the present disclosure.

In the specification, the phrase "connection of a member A and a member B" is intended to include direct physical connection of the member A and the member B as well as indirect connection thereof via other member as long as the other member has no substantial effect on the electrical connection of the member A and the member B. Similarly, the phrase "interposition of a member C between a member A and a member B" is intended to include direct connection of the member A and the member C or direct connection of the member B and the member C as well as indirect connection thereof via other member as long as the other member has no substantial effect on the electrical connection of the member A, the member B and the member C.

Figure 5:
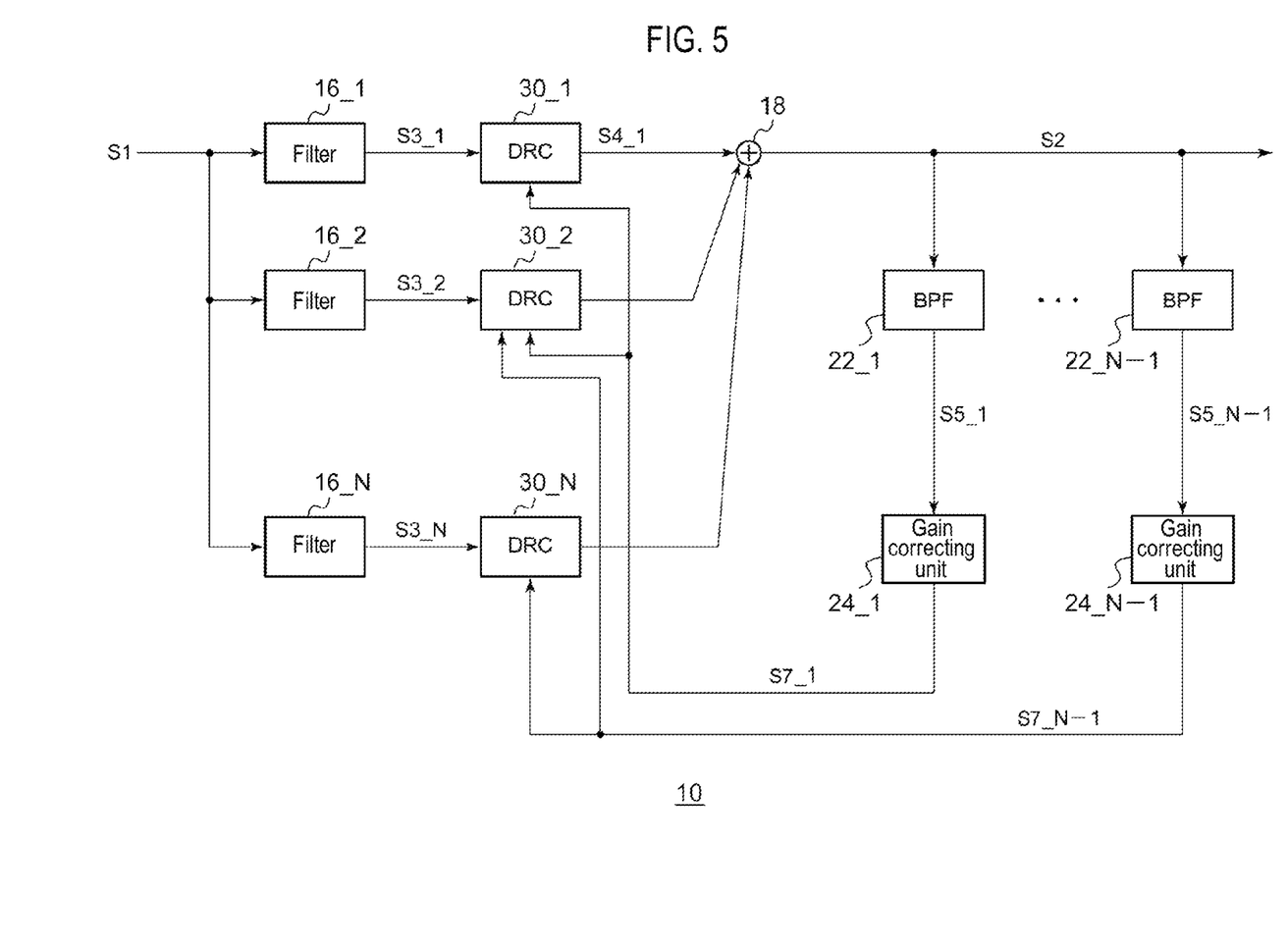
FIG. 5 is a circuit diagram of a level adjusting circuit according to an embodiment.

FIG. 5 is a circuit diagram of a level adjusting circuit 10 according to an embodiment. The level adjusting circuit 10 is configured to automatically adjust a level of an input audio signal S1 to prevent the audio signal from being clipped (or clamped) in the subsequent analog stage, and supply a level-adjusted output audio signal S2 to the subsequent analog stage. The level adjusting circuit 10 includes a plurality of N (N is an integer of two or more) filters 16_1 to 16_N, N DRC circuits 30_1 to 30_N, an adder 18, (N−1) band pass filters 22_1 to 22_N−1, and (N−1) gain correcting units 24_1 to 24_N−1.

Both of the input signal S1 and the output audio signal S2 are digital signals and the level adjusting circuit 10 is configured as a digital circuit. This embodiment will be illustrated with a case where N is 3.

The N filters 16_1 to 16_N each are configured to receive the input audio signal S1 and pass the input audio signal S1 through their respective set bands FB1 to FBN. An output of the $i^{th}$ filter 16_$i$ is denoted by S3_$i$. For N=3, the filter 16_1 refers to a low pass filer, the filter 16_2 refers to a band pass filer, and the filter 16_3 refers to a high pass filer. The cutoff frequency fc1 of the filter 16_1 and the cutoff frequency fc2L of the low pass side of the filter 16_2 are set near a first crossover frequency f1. The cutoff frequency fc2H of the high pass side of the filter 16_2 and the cutoff frequency fc3 of the filter 16_3 are set near a second crossover frequency f2.

The N DRC circuits 30_1 to 30_N correspond to the N filters 16_1 to 16_N. An $i^{th}$ ($1 \leq i \leq N$) DRC circuit 30_i is configured to amplify the signal S3_i from the $i^{th}$ filter 16_i with a variable gain Gi. The DRC circuit 30_i is configured so that the variable gain Gi can be automatically adjusted to prevent a signal level (amplitude level) of its output S4_i from exceeding a predetermined threshold level TH2. The configuration and operation of the DRC circuit 30 are as described above.

The adder 18 adds output signals S4_1 to S4_N of the N DRC circuits 30_1 to 30_N.

The (N−1) band pass filters 22_1 to 22_N−1 correspond to crossover frequencies f1 to fN−1 of the N filters 16_1 to 16_N. A $j^{th}$ ($1 \leq j \leq N-1$) band pass filter 22_j is configured to pass a band S5_j including the crossover frequencies fj of $j^{th}$ and $(j+1)^{th}$ filters 16 from the output signal S2 of the adder 18.

The (N−1) gain correcting units 24_1 to 24_N−1 correspond to the (N−1) band pass filters 22_1 to 22_N−1. A $j^{th}$ gain correcting unit 24_j is configured to adjust at least one of gains of $j^{th}$ and $(j+1)^{th}$ DRC circuits 30_j and 30_j+1 in response to the signal level of the output S5_j of the $j^{th}$ band pass filter 22_j.

For example, the $j^{th}$ gain correcting unit 24_j may adjust two gains Gj and Gj+1 of the $j^{th}$ and $(j+1)^{th}$ DRC circuits 30_j and 30_j+1 in response to the signal level of the output S5_j of the $j^{th}$ band pass filter 22_j.

If the signal level of the output S5_j of the $j^{th}$ band pass filter 22_j exceeds a predetermined threshold level TH1 the $j^{th}$ gain correcting unit 24_j may decrease the gains Gj and Gj+1 of the DRC circuits 30_j and 30_j+1 (attack operation). If the signal level of the output S5_j of the $j^{th}$ band pass filter 22_j continues to be below the predetermined threshold level TH2, the $j^{th}$ gain correcting unit 24_j may increase the gains Gj and Gj+1 of the DRC circuits 30_j and 30_j+1 (recovery operation). The gain correcting unit 24_j may generate a gain correcting signal S7_j indicating the increase/decrease of the gains of the corresponding DRC circuits 30_j and 30_j+1 and output this signal S7_j to the DRC circuits 30_j and 30_j+1.

The threshold level TH1 of the gain correcting units 24 may be equal to or different from the threshold level TH2 set in the DRC circuits 30.

Figure 6:
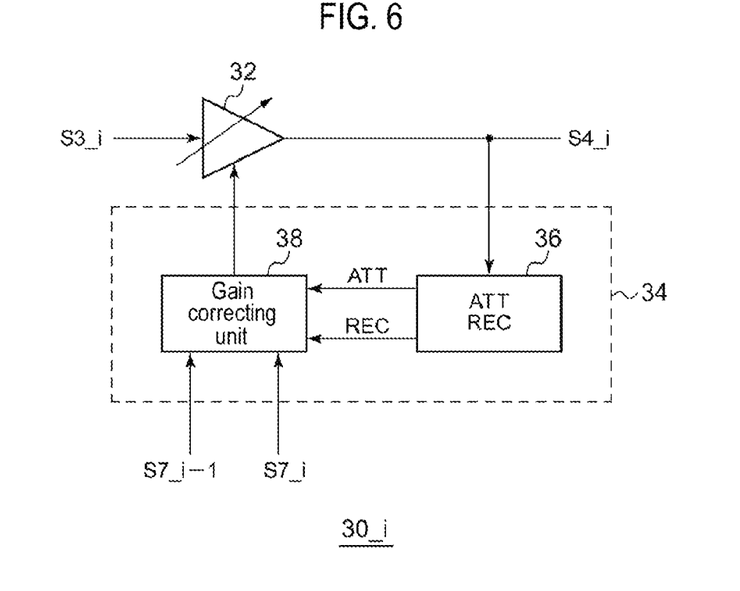
FIG. 6 is a circuit diagram showing a configuration example of an $i^{th}$ DRC circuit.

FIG. 6 is a circuit diagram showing a configuration example of the $i^{th}$ DRC circuit 30_i. The DRC circuit 30_i includes a variable gain amplifier 32 and a gain controller 34. The variable gain amplifier 32 amplifies its input signal S3_i with a variable gain Gi. The gain Gi may be set with an initial value and vary within a range that does not exceed the initial value.

The gain controller 34 is configured to control the gain Gi of the variable gain amplifier 32 based on gain correcting signals S7_i−1 and S7_i from gain correcting units 24_i−1 and 24_i shown in FIG. 5 in addition to the output signal S4_i of the variable gain amplifier 32.

The gain controller 34 includes an attack/recovery detecting unit 36 and a gain setting unit 38. If the level (amplitude) of the output signal S4_i of the variable gain amplifier 32 exceeds the predetermined threshold level TH2 (attack level), the attack/recovery detecting unit 36 may assert (for example, with a high level) an attack signal ATT. When the attack signal ATT is asserted, the gain setting unit 38 may increase the gain Gi of the variable gain amplifier 32 by a predetermined amount from the current value.

If the level of the output signal S4_i of the variable gain amplifier 32 continues to be below the threshold level TH2 during a predetermined period of time, the attack/recovery detecting unit 36 may assert (for example, with a high level) a recovery signal REC. When the recovery signal REC is asserted, the gain setting unit 38 may increase the gain Gi of the variable gain amplifier 32 by a predetermined amount. Therefore, if the level of the output signal S4_i continues to be below the threshold level TH2 for a long time, the gain Gi of the variable gain amplifier 32 returns to the initial value. The attack/recovery detecting unit 36 may employ any technique known in the art and its configuration is not particularly limited.

In addition to the attack signal ATT and the recovery signal REC from the attack/recovery detecting unit 36, the gain correcting signals S7_i−1 and S7_i are input to the gain setting unit 38. When at east one of the gain correcting signals S7_i−1 and S7_i indicates an attack operation, that is, the decrease in gain Gi, the gain setting unit 38 may decrease the gain Gi of the variable gain amplifier 32 by a predetermined amount. On the contrary, when at least one of the gain correcting signals S7_i−1 and S7_i indicates a recovery operation, that is, the increase in gain Gi, the gain setting unit 38 may increase the gain GI of the variable gain amplifier 32 by a predetermined amount.

Figure 7:
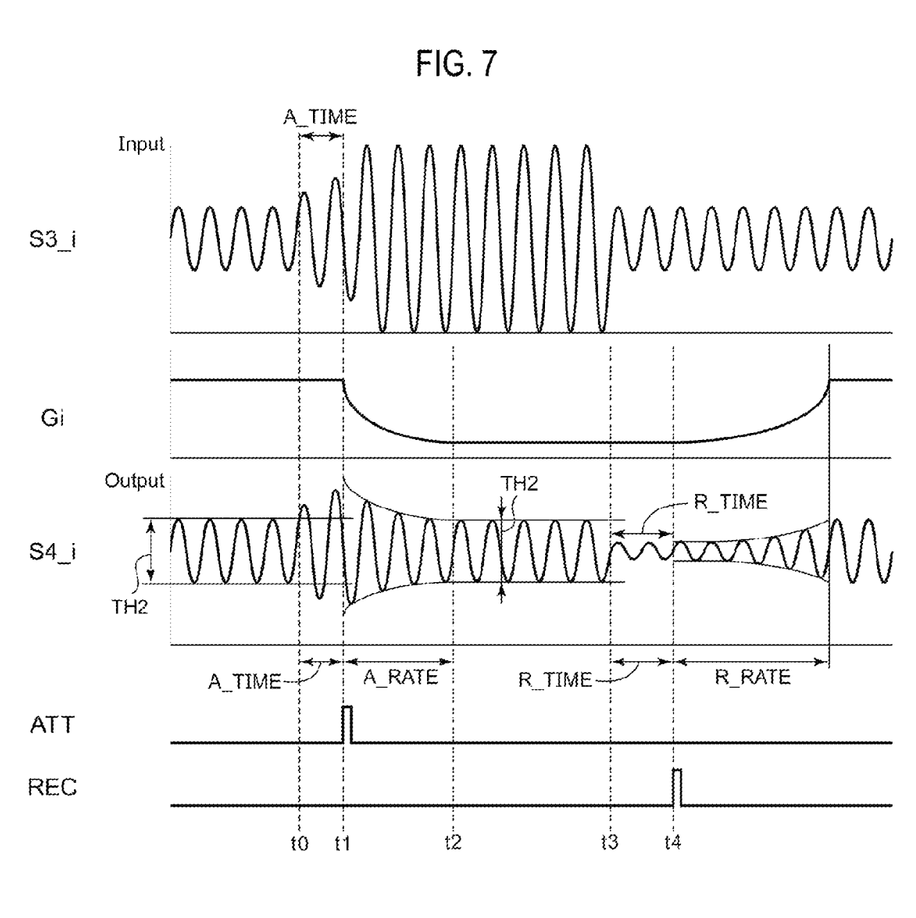
FIG. 7 is a waveform diagram showing the basic operation of the DRC circuits.

FIG. 7 is a waveform diagram showing an operation of the DRC circuits 30. Prior to time t0, since the level of the output signal S4_i of the variable gain amplifier 32 is lower than threshold level TH2, the gain Gi remains at the initial value. When the input signal S3_i increases at time t0, the level of the output signal S4_i exceeds the threshold level TH2. When this state sustains for an attack determination time A_TIME, the attack signal ATT is asserted at time t1. When the attack signal ATT is asserted, the gain Gi decreases by a predetermined margin during a predetermined attack transition time A_RATE (t1 to t2). When the gain Gi decreases, the level of the output signal S4_i remains near the threshold level TH2.

When the input signal S3_i decreases at time t3, the level of the output signal S4_i also decreases. When the level of the output signal S4_i becomes lower than the threshold level TH2 and this state sustains for a recovery determination time R_TIME, the recovery signal REC is asserted at time t4. When the recovery signal REC is asserted, the gain Gi increases by a predetermined margin during a predetermined recovery transition time R_RATE (t4 to t5). In addition, in the attack and recovery, a hysteresis is set in the threshold level TH2.

Returning to FIG. 6, when the $j^{th}$ and $(j+1)^{th}$ DRC circuits 30_j and 30_j+1 are in a non-attack operation state, the $j^{th}$ gain correcting unit 24_j decreases the gains of the $j^{th}$ and $(j+1)^{th}$ DRC circuits 30_j and 30_j+1. The phrase "DRC circuits are in an attack operation state" may mean a period of transition of the gain based on the attack signal ATT by the attack/recovery detecting unit 36 and the phrase "DRC circuits are in a non-attack operation state" may mean a state where the DRC circuits perform no attack operation.

In other words, in the attack operation state, when the gain correcting signal S7 indicates the attack operation, the $i^{th}$ DRC circuit 30_i may ignore the gain correcting signal S7 and complete the gain transition based on the current attack signal ATT. On the contrary, in the non-attack operation state, when the gain correcting signal S7 indicates the attack operation, the $i^{th}$ DRC circuit 30_i may decrease the gain Gi of the variable gain amplifier 32 in response to the gain correcting signal S7.

The DRC circuits 30 may operate as follows according to combinations of the attack signal ATT, the recovery signal REC, and the gain correcting signal S7.

(1) For the Attack Signal ATT=Assert and the Gain Correcting Signal S7=Attack

In this case, the attach instruction from the gain correcting unit 24 is ignored and the gain of the DRC circuits 30 is decreased in response to the attack signal ATT from the attack/recovery detecting unit 36.

(2) For the Attack Signal ATT=Assert and the Gain Correcting Signal S7=Recovery

In this case, the recovery instruction from the gain correcting unit 24 is ignored and the gain of the DRC circuits 30 is decreased in response to the attack signal ATT from the attack/recovery detecting unit 36.

(3) For the Recovery Signal REC=Assert and the Gain Correcting Signal S7=Attack

In this case, the gain of the DRC circuits 30 is decreased with a priority given to the attach instruction from the gain correcting unit 24.

(4) For the Recovery Signal REC=Assert and the Gain Correcting Signal S7=Recovery In this case, the recovery instruction from the gain correcting unit 24 is ignored and the gain of the DRC circuits 30 is increased in response to the recovery signal REC from the attack/recovery detecting unit 36.

In addition, in the above operations (1) to (4), the recovery operation by the gain correcting signal S7 may be disabled by setting.

Figure 8A:
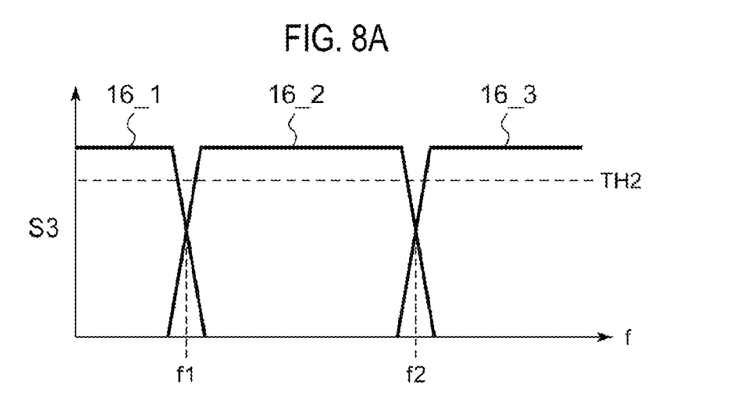
FIGS. 8A to 8C are views for explaining the operation of the level adjusting circuit of FIG. 5.
Figure 8B:
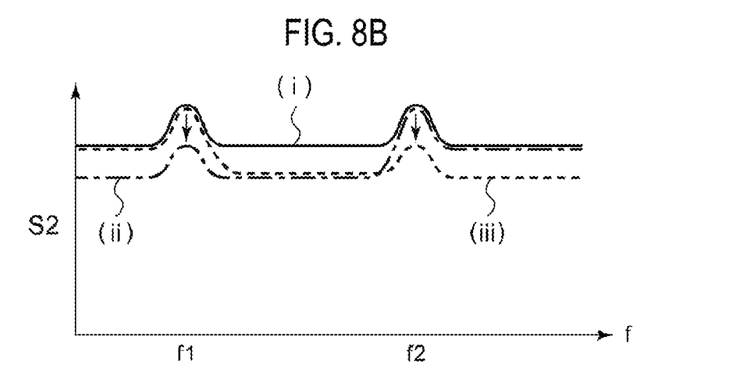
Figure 8C:
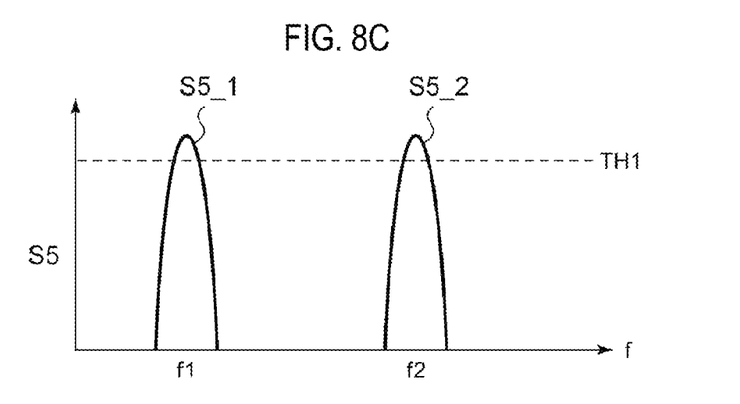

The configuration of the level adjusting circuit 10 has been described above. Subsequently, its operation will be described. FIGS. 8A to 8C are views for explaining the operation of the level adjusting circuit 10 of FIG. 5. FIG. 8A shows the band pass characteristics of the filters 16_1 to 16_3. FIG. 8B shows the band pass characteristics (i) of the level adjusting circuit 10 when the gains of all of the DRC circuits 30 have an initial value. FIG. 8C shows a spectrum of bands S5_1 and S5_2 extracted by band pass filters 22_1 and 22_2.

The gain correcting unit 24_1 may detect a signal level of the corresponding band S5_1 and compare the detected signal level with the threshold level TH1. When the DRC circuits 30_1 and 30_2 are in a non-attack operation state and the signal level exceeds the threshold level TH1, the gains of the DRC circuits 30_1 and 30_2 are decreased by a predetermined amount from the initial value. Thus, the band pass characteristics of the entire level adjusting circuit 10 are changed as shown in (ii) of FIG. 8B. Accordingly, an upsurge around the crossover frequency f1 may be suppressed.

Similarly, the gain correcting unit 24_2 may detect a signal level of the corresponding band S5_2 and compare the detected signal with the threshold level TH1. When the DRC circuits 30_2 and 30_3 are in a non-attack operation state and the signal level exceeds the threshold level TH1, the gains of the DRC circuits 30_2 and 30_3 are decreased by a predetermined amount from the initial value. Thus, the band pass characteristics of the entire level adjusting circuit 10 are changed as shown in (iii) of FIG. 8B. Accordingly, an upsurge around the crossover frequency f2 may be suppressed.

The operation of the level adjusting circuit 10 has been described above. According to the level adjusting circuit 10, it is possible to improve the sound quality since DRC processing for each band. In addition, since the gains of the DRC circuits are corrected based on a signal level of a band including a crossover frequency, it is possible to suppress an upsurge of the signal level at the crossover frequency.

Furthermore, the gain correction by the gain correcting unit 24 is limited depending on the state of the automatic gain adjustment of the DRC circuits. Accordingly, it is possible to prevent the concurrence of the attack operation by the attack/recovery detecting unit 36 and the attack operation by the gain correcting unit 24 of the DRC circuits 30, thereby reducing the disharmony of the hearing sense.

In addition, in the level adjusting circuit 10r shown in FIG. 3B, if an upsurge occurs near a certain crossover frequency (for example, f1), a sound pressure is decreased since the gain of the entire band is decreased by the DRC circuits 20. As opposed to this, with the level adjusting circuit 10 of FIG. 5, even if an upsurge occurs near the crossover frequency f1, since only the gain of a band adjacent to the crossover frequency f1 is changed and the gains of bands having no connection with the crossover frequency f1 are maintained, the sound pressure can be prevented from being decreased, as compared to the above case in which the gain of the entire band is decreased.

(Application)

Figure 9:
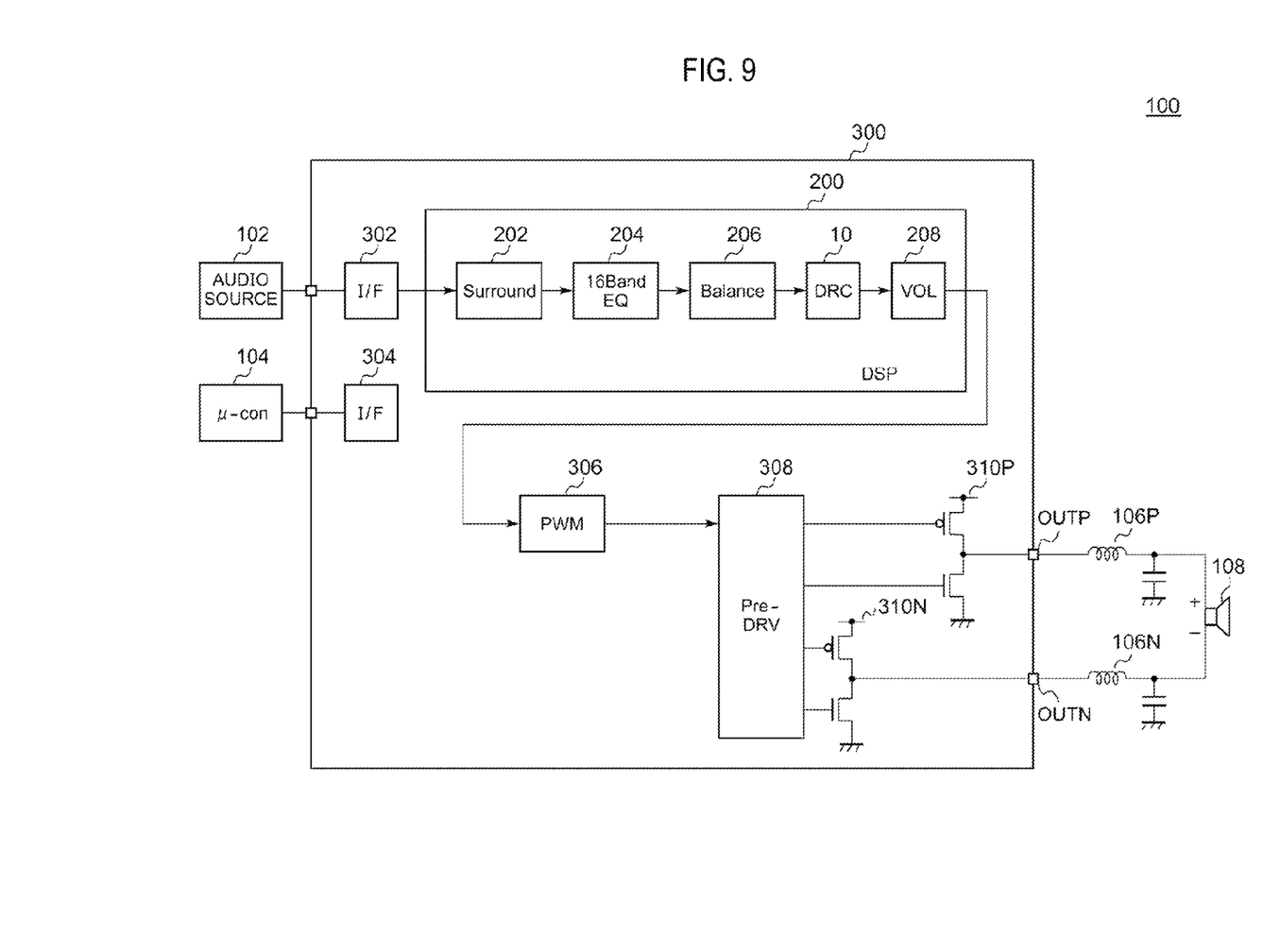
FIG. 9 is a block diagram of an electronic apparatus including a level adjusting circuit.

Subsequently, applications of the level adjusting circuit 10 will be described. FIG. 9 is a block diagram of a electronic apparatus 100 including the level adjusting circuit 10. The level adjusting circuit 10 is configured by a DSP 200, together with a surround processor 202, a multiband equalizer 204, a balance circuit 206, and a volume circuit 208. The functionality of the DSP 200 is not particularly limited but may include a pre-scaler and bass boost circuit. An order of signal processing of these blocks is not also particularly limited.

An audio amplifier integrated circuit (IC) 300, which is an audio amplifier equipped with the DSP functionality, includes an interface circuit 302 for audio, an interface circuit 304 for control, a pulse modulator 306, a pre-driver 308, D-class amplifiers 310P, and 310N, in addition to the DSP 200. Although the configuration of a single channel is shown in FIG. 9, the audio amplifier IC 300 is configured to drive a multichannel speaker 108.

The interface circuit 302, which is, example, an I$^2$S (Inter IC Sound) interface, may receive digital audio data in a serial form from an audio source 102. The interface circuit 304, which is, for example, an I$^2$C (Inter IC) interface, may receive various control signals in a serial form from a microcontroller 104.

An audio signal received by the interface circuit 302 is input to the DSP 200. The audio signal is subjected to signal processing by the DSP 200 and is input to the pulse modulator 306. The pulse modulator 306 may generate a pulse signal which is pulse width-modulated based on the audio signal from the DSP 200. The pre-driver 308 may switch the D-class amplifiers 310P and 310N based on the pulse signal from the pulse modulator 306. An output OUTP of the D-class amplifier 310P is connected to a positive (+) input of the speaker 108 via a low pass filter 106P and an output OUTN of the D-class amplifier 310N is connected to a negative (−) input of the speaker 108 via a low pass filter 106N. The audio amplifier IC 300 may drive the speaker 108 in a BTL manner.

The configuration of the electronic apparatus 100 has been described above. In the audio amplifier IC 300, the digital stage at a front stage and the D-class amplifiers at a rear stage may be integrated on separate semiconductor chips.

Figure 10A:
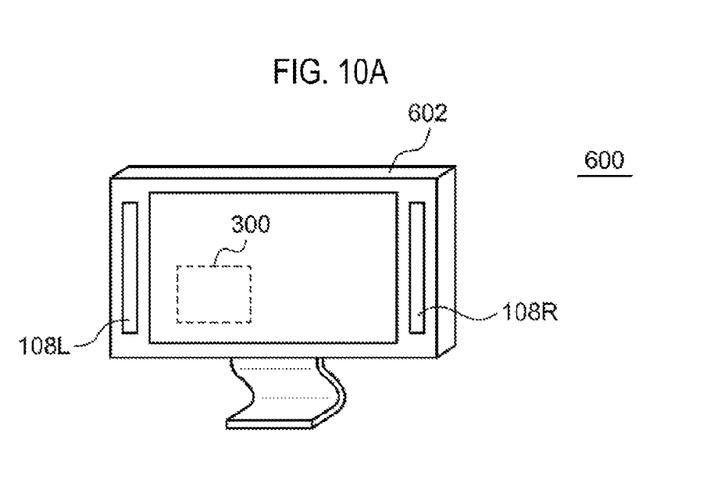
FIGS. 10A to 10C are views showing the external appearance of the electronic apparatus.
Figure 10B:
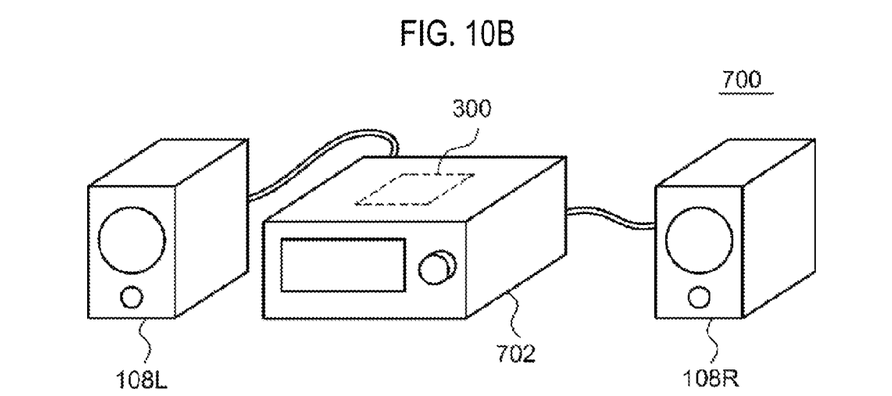
Figure 10C:
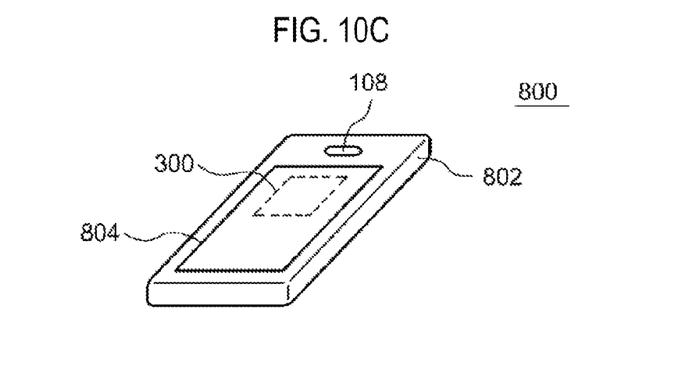

FIGS. 10A to 10C are views showing the external appearance of the electronic apparatus 100. FIG. 10A shows a display 600 as one example of the electronic apparatus 100. The display 600 includes a housing 602 and speakers 108L and 108R. The audio amplifier IC 300 may be incorporated in the housing 602 and drive the speakers 108L and 108R.

FIG. 10B shows an audio system 700 as one example of the electronic apparatus 100. The audio system 700 includes a housing 702 and speakers 108L and 108R. The audio amplifier IC 300 may be incorporated in the housing 702 and drive the speakers 108L and 108R.

FIG. 10C shows a small information terminal 800 as one example of the electronic apparatus 100. The small information terminal 800 may be a mobile phone, PHS (Personal Handy-phone System), PDA (Personal Digital Assistant), tablet PC (Personal Computer), audio player or the like. The small information terminal 800 includes a housing 802, a speaker 108, and a display 804. The audio amplifier IC 300 may be incorporated in the housing 802 and drive the speaker 108.

By employing the audio amplifier IC 300 in the electronic apparatuses as shown in FIGS. 10A to 10C, a high quality sound can be realized. Further, the audio amplifier IC 300 can be applied to intercoms and the like.

The present disclosure has been described above by way of embodiments. The disclosed embodiments are illustrative only. It should be understood by those skilled in the art that various modifications to combinations of elements or processes may be made and such modifications fall within the scope of the present disclosure. Some exemplary modifications will be described below.

First Modification

Although the case of N=3 has been described in the above embodiments, N may be 2 or 4 or more.

Second Modification

Although it has been illustrated in the above embodiments that the $j^{th}$ gain correcting unit 24_$j$ corrects both gains of the $j^{th}$ and $(j+1)^{th}$ DRC circuits 30_$j$ and 3_$j$+1 based on the signal level of the output signal S5_$j$ of the $j^{th}$ band pass filter 22_$j$, the present disclosure is not limited thereto. For example, the gain correcting unit 24_1 may correct the gain of only the first DRC circuit 30_1 or the gain of only the second DRC circuit 30_2 based on the signal level of the output signal S5_1 of the band pass filter 22_1.

According to the present disclosure in some embodiments, it is possible to provide a level adjusting circuit which is capable of improving the sound quality.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A level adjusting circuit for adjusting a level of an input audio signal, comprising:
    a plurality of N filters, wherein each of the filters is configured to receive the input audio signal and pass the received input audio signal through its respective set band, and N is an integer of two or more;
    a plurality of N dynamic range compression (DRC) circuits corresponding to the plurality of N filters, wherein an $i^{th}$ ($1 \leq i \leq N$) DRC circuit of the plurality of N DRC circuits is configured to amplify a signal from an $i^{th}$ filter of the plurality of N filters and adjust a gain of the $i^{th}$ DRC circuit so as to prevent a level of an output signal of the $i^{th}$ DRC circuit from exceeding a predetermined threshold level;
    an adder configured to add each of the output signals of the N DRC circuits;
    (N-1) band pass filters corresponding to crossover frequencies of the plurality of N filters, wherein a $j^{th}$ ($1 \leq j \leq N-1$) band pass filter of the (N-1) band pass filters is configured to pass a band including crossover frequencies of $j^{th}$ and $(j+1)^{th}$ filters of the plurality of N filters from an output signal of the adder; and
    (N-1) gain correcting units corresponding to the (N-1) band pass filters, wherein a $j^{th}$ gain correcting unit of the (N-1) gain correcting units is configured to adjust at least one of gains of $j^{th}$ and $(j+1)^{th}$ DRC circuits of the plurality of N DRC circuits based on a level of an output signal of the $j^{th}$ band pass filter.

2. The level adjusting circuit of claim 1, wherein if the level of the output signal of the $j^{th}$ band pass filter exceeds a predetermined threshold level, the $j^{th}$ gain correcting unit decreases at least one of the gains of the $j^{th}$ and $(j+1)^{th}$ DRC circuits.

3. The level adjusting circuit of claim 1, wherein if the $j^{th}$ and $(j+1)^{th}$ DRC circuits are in a non-attack operation state, the $j^{th}$ gain correcting unit decreases the gains of the $j^{th}$ and $(j+1)^{th}$ DRC circuits.

4. The level adjusting circuit of claim 1, wherein, if the $i^{th}$ DRC circuit is in a non-attack operation state and receives an instruction of gain decrease from a corresponding gain correcting unit, the $j^{th}$ DRC circuit decreases the gain of the $j^{th}$ DRC circuit.

5. The level adjusting circuit of claim 1, wherein the level adjusting circuit is integrated on a single semiconductor substrate.

6. A digital sound processor comprising the level adjusting circuit of claim 1.

7. An electronic apparatus comprising:
    an electro-acoustic transducer;
    a digital sound processor including the level adjusting circuit of claim 1;
    a pulse modulator configured to receive an audio signal output from the digital sound processor and generate a pulse signal which is pulse-modulated based on the audio signal; and
    a D-class amplifier configured to receive the pulse signal and drive the electro-acoustic transducer.

8. An audio amplifier integrated circuit comprising:
    a digital sound processor including the level adjusting circuit of claim 1;
    a pulse modulator configured to receive an audio signal output from the digital sound processor and generate a pulse signal which is pulse-modulated based on the audio signal; and
    a D-class amplifier configured to receive the pulse signal.

9. An electronic apparatus comprising:
    an electro-acoustic transducer; and
    the audio amplifier integrated circuit of claim 8, configured to drive the electro-acoustic transducer.

10. A method of adjusting a level of an input audio signal, comprising:
dividing the input audio signal into a plurality of bands;
dynamic range compression (DRC) processing each of the plurality of bands;
synthesizing the plurality of bands, which has been DRC processed, to obtain a synthesized signal;
extracting a band including crossover frequencies of the plurality of bands from the synthesized signal; and
correcting the DRC processing for each of the plurality of bands based on a level of the band including the crossover frequencies.

11. A level adjusting circuit for adjusting a level of an input audio signal, comprising:
a first and a second filters, wherein each of the first and the second filters is configured to receive the input audio signal and pass the received input audio signal through its respective set band;
a first and a second dynamic range compression (DRC) circuits corresponding to the first and the second filters, respectively, wherein the first DRC circuit is configured to amplify a signal from the first filter and adjust a gain of the first DRC circuit so as to prevent a level of an output signal of the first DRC circuit from exceeding a first predetermined threshold level, and the second DRC circuit is configured to amplify a signal from the second filter and adjust a gain of the second DRC circuit so as to prevent a level of an output signal of the second DRC circuit from exceeding a second predetermined threshold level;
an adder configured to add each of the output signals of the first and the second DRC circuits;
a band pass filter corresponding to crossover frequencies of the first and the second filters, wherein the band pass filter is configured to pass a band including the crossover frequencies of the first and the second filters from an output signal of the adder; and
a gain correcting unit corresponding to the band pass filter, wherein the gain correcting unit is configured to adjust at least one of gains of the first and the second DRC circuits based on a level of an output signal of the band pass filter.

12. The level adjusting circuit of claim 11, wherein if the level of the output signal of the band pass filter exceeds a predetermined threshold level, the gain correcting unit decreases at least one of the gains of the first and the second DRC circuits.

13. The level adjusting circuit of claim 11, wherein if the first and the second DRC circuits are in a non-attack operation state, the gain correcting unit decreases the gains of the first and the second DRC circuits.

14. The level adjusting circuit of claim 11, wherein, if the first DRC circuit is in a non-attack operation state and receives an instruction of gain decrease from the gain correcting unit, the first DRC circuit decreases the gain of the first DRC circuit.

* * * * *